US012491716B2

(12) United States Patent
Wang et al.

(10) Patent No.: US 12,491,716 B2
(45) **Date of Patent: *Dec. 9, 2025**

(54) CORROSION TOLERANT MICRO-ELECTROMECHANICAL FLUID EJECTION DEVICE

(71) Applicant: Hewlett-Packard Development Company, L.P., Spring, TX (US)

(72) Inventors: Stanley J. Wang, Corvallis, OR (US); Anthony M. Fuller, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 280 days.

This patent is subject to a terminal disclaimer.

(21) Appl. No.: 18/465,031

(22) Filed: Sep. 11, 2023

(65) Prior Publication Data

US 2023/0415482 A1 Dec. 28, 2023

Related U.S. Application Data

(63) Continuation of application No. 17/414,140, filed as application No. PCT/US2019/029675 on Apr. 29, 2019, now Pat. No. 11,787,180.

(51) Int. Cl.
*B41J 2/14* (2006.01)
*B01L 3/00* (2006.01)
*B81B 7/00* (2006.01)

(52) U.S. Cl.
CPC ....... *B41J 2/1433* (2013.01); *B01L 3/502715* (2013.01); *B81B 7/0025* (2013.01); *B01L 2200/12* (2013.01); *B81B 2201/052* (2013.01)

(58) Field of Classification Search
CPC .... B41J 2/1433; B41J 2202/13; B41J 2/1404; B41J 2/14072; B41J 2/16; B41J 2/1626;
(Continued)

(56) References Cited

U.S. PATENT DOCUMENTS 5,122,812 A 6/1992 Hess et al.
5,159,353 A 10/1992 Fasen et al.
(Continued)

FOREIGN PATENT DOCUMENTS

CN 1700423 A 11/2005
CN 1986386 A 6/2007
(Continued)

*Primary Examiner* — Bradley W Thies
(74) *Attorney, Agent, or Firm* — Foley & Lardner LLP

(57) ABSTRACT

Aspects of the present disclosure are directed to an apparatus including a circuit region and a fluidic region. In a particular example, the circuit region with logical circuits thereon, includes a thermal oxide layer on a silicon substrate, and a dielectric layer over the field oxide layer, the dielectric layer including a doped dielectric film. The microfluidic device further includes a fluidic region including fluid ports formed through a surface of the apparatus and including an undoped dielectric film. The fluidic region includes an aperture in the dielectric layer, where the aperture is defined by a dielectric wall which forms part of the dielectric layer. A sealing film deposited over the dielectric wall may prevent the doped dielectric film from contacting fluid contained in the fluid port.

15 Claims, 6 Drawing Sheets

(58) Field of Classification Search
CPC ... B41J 2/1631; B41J 2/164; B01L 3/502715; B01L 2200/12; B01L 2300/0887; B01L 3/0268; B81B 7/0025; B81B 2201/052
See application file for complete search history.

(56) References Cited

U.S. PATENT DOCUMENTS

| | | | |
|---|---|---|---|
| 5,576,572 | A | 11/1996 | Maeda et al. |
| 5,870,121 | A | 2/1999 | Chan |
| 6,130,472 | A | 10/2000 | Feger et al. |
| 6,758,552 | B1 | 7/2004 | Figueredo |
| 6,846,068 | B2 | 1/2005 | Kim |
| 6,891,155 | B2 | 5/2005 | Li et al. |
| 7,025,894 | B2 | 4/2006 | Hess et al. |
| 7,125,739 | B2 | 10/2006 | Harris et al. |
| 7,332,100 | B2 | 2/2008 | Giovanola et al. |
| 7,686,421 | B2 | 3/2010 | Yasoshima et al. |
| 7,735,976 | B2 | 6/2010 | Cha et al. |
| 8,084,361 | B2 | 12/2011 | Huang et al. |
| 8,567,909 | B2 | 10/2013 | Sieber |
| 9,498,953 | B2 | 11/2016 | Fuller et al. |
| 11,787,180 | B2 * | 10/2023 | Wang .................... B01L 3/0268 347/45 |
| 2003/0081068 | A1 | 5/2003 | Hayakawa et al. |
| 2003/0228764 | A1 | 12/2003 | Khan et al. |
| 2004/0086427 | A1 | 5/2004 | Childers et al. |
| 2004/0087151 | A1 | 5/2004 | Dodd et al. |
| 2008/0165225 | A1 | 7/2008 | Kitahara et al. |
| 2009/0283844 | A1 | 11/2009 | Sparks |
| 2010/0199497 | A1 | 8/2010 | Anderson et al. |
| 2011/0018930 | A1 | 1/2011 | Bhwomik et al. |
| 2011/0120871 | A1 | 5/2011 | Reid et al. |
| 2012/0293587 | A1 | 11/2012 | Bakker et al. |
| 2012/0298622 | A1 | 11/2012 | White et al. |
| 2013/0149215 | A1 | 6/2013 | Dekker et al. |
| 2015/0129542 | A1 | 5/2015 | Ohsumi et al. |
| 2015/0210076 | A1 | 7/2015 | Rivas et al. |
| 2017/0072692 | A1 | 3/2017 | Chen et al. |
| 2018/0236445 | A1 | 8/2018 | Giusti et al. |

FOREIGN PATENT DOCUMENTS

| | | | |
|---|---|---|---|
| CN | 101405084 | A | 4/2009 |
| CN | 101765506 | A | 6/2010 |
| CN | 101932933 | A | 12/2010 |
| CN | 106976316 | A | 7/2017 |
| CN | 108452967 | A | 8/2018 |
| EP | 1078754 | A2 | 2/2001 |
| JP | 08-072246 | A | 3/1996 |
| JP | 08-187867 | A | 7/1996 |
| JP | 2001-071502 | A | 3/2001 |
| JP | 2003-136492 | A | 5/2003 |
| JP | 2013-230594 | A | 11/2013 |
| JP | 2015-093445 | A | 5/2015 |
| KR | 10-2001-0058618 | A | 7/2001 |
| RU | 1840163 | A1 | 6/2006 |
| TW | 514598 | B | 12/2002 |
| TW | 200406868 | A | 5/2004 |
| TW | 200602195 | A | 1/2006 |
| TW | 200824913 | A | 6/2008 |
| WO | 2016/122584 | A1 | 8/2016 |
| WO | 2017/075344 | A1 | 5/2017 |

* cited by examiner

CORROSION TOLERANT MICRO-ELECTROMECHANICAL FLUID EJECTION DEVICE

CROSS-REFERENCE TO RELATED PATENT APPLICATIONS

This application is a Continuation patent application that claims priority under 35 U.S.C. § 120 to U.S. patent application Ser. No. 17/414,140, filed Jun. 15, 2021, which is a U.S. National Stage Entry under 35 U.S.C. § 371 of International Application No. PCT/US2019/029675, filed Apr. 29, 2019, the contents of all such applications being hereby incorporated by reference in their entirety and for all purposes as if completely and fully set forth herein.

BACKGROUND

A microfluidic device including a fluid ejection channel defined by a fluid barrier and an orifice, or nozzle, for containing and/or passing fluids, and further including micro-electromechanical systems (MEMS) and/or electronic circuitry may be fabricated on a silicon substrate and included in a fluid ejection system. Various microfabrication techniques used for fabricating semiconductor devices may be used to manufacture such microfluidic devices.

BRIEF DESCRIPTION OF THE DRAWINGS

Various example may be more completely understood in consideration of the following detailed description in connection with the accompanying drawings, in which.

Figure 1:
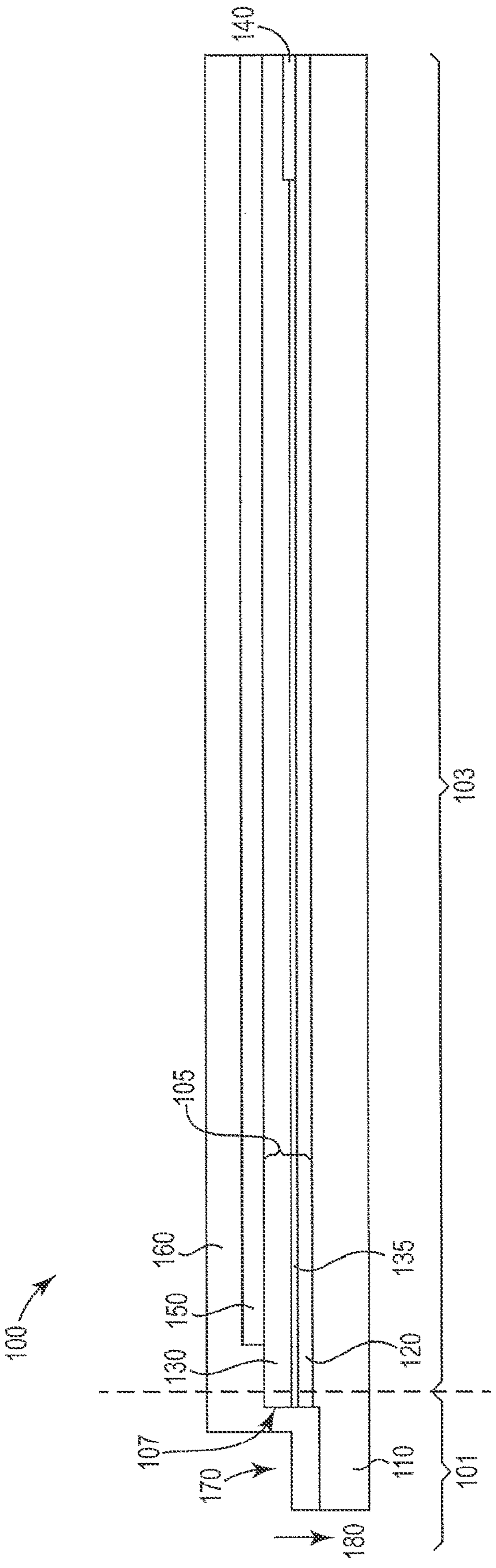
FIG. 1 illustrates an example apparatus including a circuit region and a fluidic region, consistent with the present disclosure.

While various examples discussed herein are amenable to modifications and alternative forms, aspects thereof have been shown by way of example in the drawings and will be described in detail. It should be understood, however, that the intention is not to limit the disclosure to the particular examples described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

The present disclosure relates to an apparatus including a fluid seal structure. Micro-electro mechanical systems (MEMS) and circuitry may be integrated into the same apparatus (e.g., formed on the same substrate), and the apparatus may include a plurality of microfluidic architectural features. An example of a microfluidic architectural feature that may be included in an apparatus is an aperture, which may contain fluid, and/or permit the passage/ejection of fluid from fluid ports (e.g., holes), or nozzles, included in an apparatus of which the microfluidic device is a part. Moreover, the aperture may be sealed with a film to protect the MEMS and circuitry included therein from being exposed to the corrosive properties of the fluid contained in the aperture, passing there through, and/or being ejected therefrom. In some examples, the aperture may be an area in which the apparatus was cleared of its dielectric layer which may include a dielectric film. A non-limiting example of such an apparatus may include a printhead, or printhead die, while a non-limiting example of a fluid contained in, passing through, and/or being ejected from a microfluidic device may include ink, polymeric materials, and/or biologic substances. As used herein, the term 'collocated' may refers to or includes a MEMS microfluidic device and integrated circuitry being disposed on the same substrate, being within a threshold distance of each other, and vertically and/or horizontally abutting each other.

Examples of the present disclosure are directed to an apparatus including a circuit region with logical circuits thereon and including a doped dielectric film. The circuit region includes a thermal oxide layer on a substrate, a dielectric layer over the field oxide layer which includes a doped dielectric film. Also included in the apparatus may be a fluidic region including a fluid port having a width sufficient to dispense a fluid there through, and formed through a surface of the apparatus. The fluidic region may include an aperture in the dielectric layer, the aperture being defined by a dielectric wall which forms part of the dielectric layer. A sealing film may be over the dielectric wall that prevents the doped dielectric film from contacting fluid contained in the fluid port. The sealing film may include an un-doped dielectric layer and/or tetraethyl orthosilicate (TEOS) deposited over the dielectric wall. The above-described apparatus may include an intermediate product in which the aperture may be filled with the un-doped dielectric layer, and a portion of the un-doped dielectric layer in the aperture may be removed using a planarization process.

Additional aspects of the present disclosure are directed to an apparatus including a monolithic integrated circuit with logical circuits formed thereon, and including a doped dielectric film. The monolithic integrated circuit may include a field oxide layer on a substrate, the doped dielectric film over the field oxide layer, and a metal layer over the doped dielectric film. Also included in the apparatus is a microfluidic device collocated with the monolithic integrated circuit, the microfluidic device including an aperture disposed in a region of the microfluidic device to eject fluid, in which the aperture is defined by a wall of the doped dielectric film. The microfluidic device may further include an un-doped dielectric layer disposed over the wall of the doped dielectric layer to protect the doped dielectric film of the monolithic integrated circuit from corrosive attributes of the fluid.

The monolithic integrated circuit may include a polysilicon layer deposited over the field oxide layer and before the doped dielectric film. An intermediate product of the apparatus may include the monolithic integrated circuit having a polysilicon layer deposited over the field oxide and before the doped dielectric film, the polysilicon layer including an overlay region of polysilicon extending beyond the wall of the doped dielectric film. An intermediate product of the apparatus may also include the monolithic integrated circuit having a second substrate layer deposited over the field oxide and before the doped dielectric film, the second substrate layer including a substrate having a higher photolithography etch rate as compared to a photolithography etch rate of the doped dielectric film.

Certain examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or example can be combined with features of another figure or example even though the combination is not explicitly shown or explicitly described as a combination.

FIG. 1 illustrates an example apparatus 100 including a circuit region and a fluidic region, consistent with the present disclosure. Particularly, FIG. 1 illustrates a circuit region 103 with logical circuits thereon, and a fluidic region 101 including a fluid port 180 formed through a surface of the apparatus. As illustrated in FIG. 1, the circuit region 103 may include a doped dielectric film 130. The circuit region 103 may further include a thermal oxide layer 120 on a silicon substrate 110, and a dielectric layer 105 over the thermal oxide layer 120, where the dielectric layer 105 includes the doped dielectric film 130. The fluidic region 101 may include a fluid port 180 formed through a surface of the apparatus 100 such that fluid may be ejected from the apparatus 100. The apparatus 100 may include an aperture 170 in the dielectric layer, where the aperture 170 is defined by a dielectric wall 107 which forms part of the dielectric layer 105. A sealing film 160 may be deposited over the dielectric wall 107, which prevents the doped dielectric film 130 from contacting fluid contained in the fluid port 180.

In some examples, the sealing film 160 includes an un-doped dielectric film over the dielectric wall 107. The sealing film 160 may be an electrically insulating and corrosion resistant barrier to the doped dielectric film 130. As a non-limiting example, the sealing film 160 may be TEOS. In some examples, the sealing film 160 may also directly cover the substrate 110. Additionally, the sealing film 160 may be directly cover a first metal layer 150. A portion of the doped dielectric film 130 may be selectively removed to form the aperture 170. As used herein, the aperture 170 refers to or includes a portion of the apparatus between the dielectric 130 and the fluid port 180. As illustrated in FIG. 1, a portion of the aperture 170 may terminate at a termination point in the substrate 110. For instance, a portion of the substrate 110 may be removed in the process of forming the aperture 170. Additionally and/or alternatively, the portion of the aperture may terminate at a termination point in the thermal oxide layer 120, such that a portion of the thermal oxide layer 120 may be removed in the process of forming the aperture 170. As a further example, a portion of the aperture may terminate at the thermal oxide layer 120, such that the thermal oxide layer 120 is not removed in the process of forming the aperture 170. Additionally and/or alternatively, a portion of the aperture may terminate at the substrate layer 110, such that the substrate layer 110 is not removed in the process of forming the aperture 170. Examples are not so limited, and additional termination points for the aperture 170 are contemplated.

Where reference is made to a "first metal", a "second metal", etc., the adjectives "first" and "second" are not used to connote any description of the structure or to provide any substantive meaning; rather, such adjectives are merely used to differentiate one such similarly-named structure from another similarly-named structure.

Manufacturing apparatus 100, including MEMS and circuitry monolithically integrated on the same substrate 110 may use some of the same processes used to manufacture planar integrated circuits, including but not limited to various forms of etching and photolithography, which expose the doped dielectric film included in the dielectric layer 105 to the corrosive properties of the fluid passing through the fluid port 180. The sealing film 160, which in a number of examples may be TEOS, may be an electrically insulating material resistive to the corrosive attributes of the fluid contained in the fluid port 180. The sealing film 160 protects the apparatus 100 from the corrosive attributes included therein by forming a boundary between the fluid and the MEMS/circuitry included in the apparatus 100. Sealing film 160 may directly cover the first metal layer 150 and the portion of the dielectric film 130 within the aperture 170. In some examples, the sealing film 160 may also directly cover the substrate 110.

Although not specifically illustrated in FIG. 1, the sealing film 160 may be used to backfill the aperture 170, in some instances completely, before the printhead die is planarized by, for example, a chemical-mechanical planarization (CMP) and/or resist etch back process. The result of such processing is an apparatus 100 including an area in which the dielectric film 130 is present, such as circuit region 103, and an area in which the dielectric film 130 has been removed, backfilled with the sealing film 160, such as fluidic region 101, and then planarized. In more specific examples, after growing the thermal oxide layer 120, gate control for the circuitry included in the apparatus may be achieved by depositing a polysilicon layer, or polygate 140 between the thermal oxide layer 120 and the dielectric film 130.

Figure 2A:
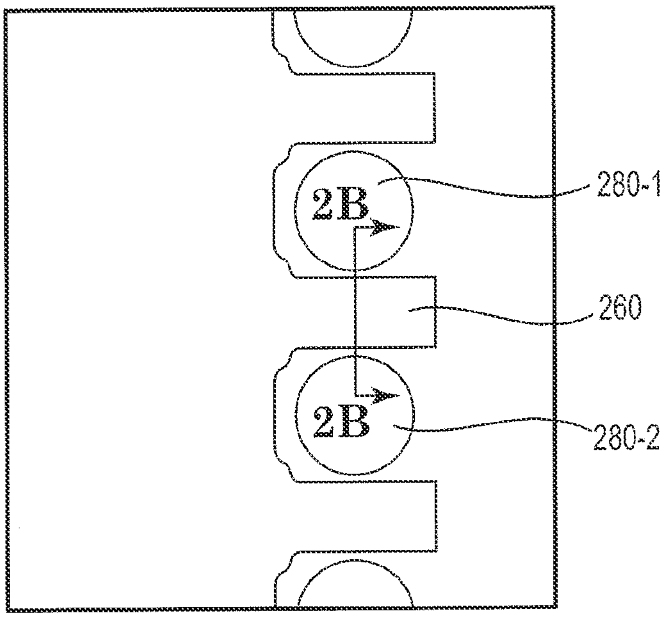
FIGS. 2A and 2B illustrate an example cross-section of an apparatus having multiple fluid ports, consistent with the present disclosure.
Figure 2B:
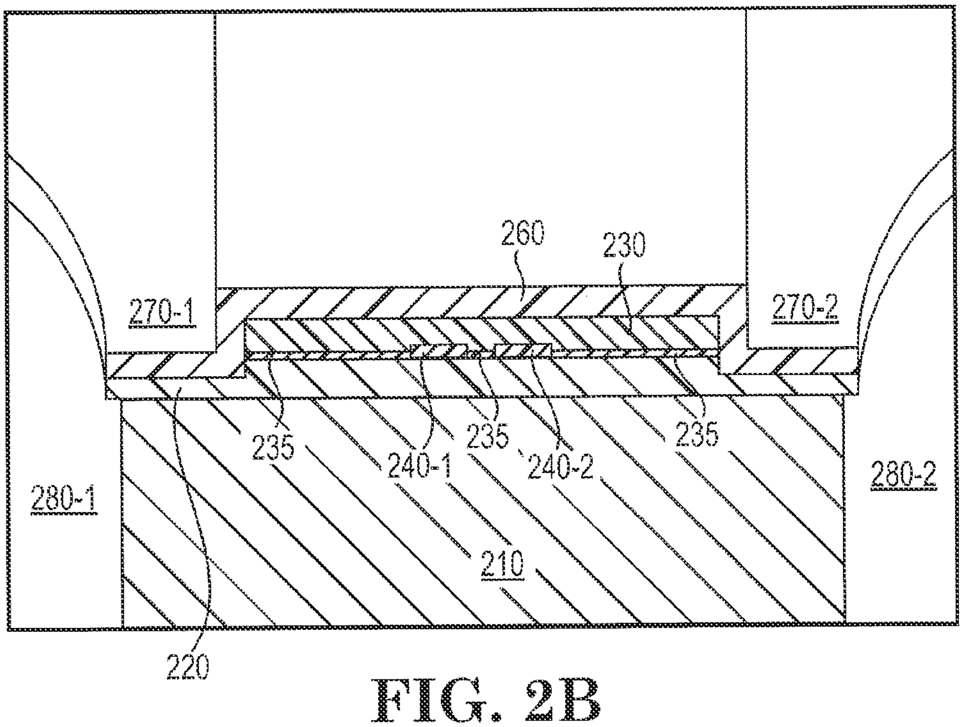

FIGS. 2A and 2B illustrate an example cross-section of an apparatus having multiple fluid ports, consistent with the present disclosure. More particularly, FIGS. 2A and 2B illustrate a microfluidic device, or multiple such microfluidic devices, as may be included in, for example, an inkjet printhead, a portion of which is illustrated in FIG. 2A. The inkjet printhead may include a fluid ejection system in which fluid, such as ink, is ejected from fluid ports 280-1, 280-2 (collectively referred to herein as "fluid ports 280") onto, for instance, print media. Although ink is used as an example fluid herein, examples are not so limited. For instance, example fluids may include polymers or other materials for three-dimensional (3-D) printing, and/or biologic fluids, among others. The combination of a microfluidic device included in an inkjet printhead and the fluid ejection system included in the microfluidic device may be referred to as, an inkjet printhead assembly. Such an inkjet printhead assembly may be included in, for instance, an inkjet printing system such as a printer (not shown).

The inkjet printing system may further include an ink supply assembly, a mounting assembly, a media transport assembly, an electronic controller, and a power supply for providing power to the various MEMS and integrated circuitry included in the inkjet printing system. Moreover, fluid ejection devices, in some instances fluid ports, apertures, moats, and the like, included in the fluid ejection system of the printhead may be implemented as fluid drop jetting printhead dies for ejecting drops of ink through a plurality of fluid ports 280. The fluid ports may also be referred to herein as nozzles or orifices. The fluid ports 280 may be arranged in a column, or as an array such that properly sequenced ejections of ink through the ports 280 cause characters, symbols, and/or other graphics/images/objects to be printed. The print media included in the inkjet print system may be any type of suitable sheet or roll material, including but not limited to paper, card stock, transparencies, Mylar, and/or other substances for 3-D printing. In additional examples, the fluid ports 280 may eject the fluid to a waste chamber, as may be used in polymerase chain reaction (PCR) and/or other biologic assay examples.

An inkjet printhead included in an inkjet printhead assembly may be supplied fluid ink from an ink supply assembly (not shown) included in an inkjet print system of which the inkjet printhead assembly is a part. The ink supply assembly may include a reservoir for storing fluid ink. Ink flows from the reservoir to the inkjet printhead assembly and through the fluid ports 280. With corrosive fluids being disposed within fluid ports 280, the integrated circuits disposed between the fluid ports 280 are susceptible to corrosion. Accordingly, a portion of the dielectric material may be removed from the integrated circuit and coated with a sealing film, so as to protect the integrated circuit from the corrosive properties of the fluid.

FIG. 2B illustrates a cross section view of the printhead structure along the line illustrated between fluid ports 280-1 and 280-2. As discussed with regards to FIG. 1, the apparatus illustrated in FIG. 2B includes a first region including logic circuits, such as a circuit region (e.g., 103 illustrated in FIG. 1) and a second region, such as a fluidic region (e.g., 101 illustrated in FIG. 1). In some examples, the first region may be referred to as a monolithic integrated circuit, and the second region may be referred to as a microfluidic device or MEMS. The monolithic integrated circuit may include a field oxide layer 220 over a substrate 210, a doped dielectric film 230 over the field oxide layer 220, and a metal (not illustrated in FIG. 2) over the doped dielectric film 230. The microfluidic device, collocated on the apparatus, may include an aperture (two apertures 270-1, 270-2 illustrated in FIG. 2B). Each aperture may be disposed in a region of the microfluidic device, and the aperture is defined by a wall of the doped dielectric film 230, as discussed with regards to FIG. 1. An un-doped dielectric film 260 over the wall of the doped dielectric film 230 may protect the doped dielectric film 230 of the monolithic integrated circuit from corrosive attributes of the fluid ejected from fluid ports 280-1, 280-2.

As illustrated in FIG. 2B, each fluid port 280-1, 280-2 may be separated by a substrate 210, discussed with regards to FIG. 1. As such, the microfluidic device, or fluidic region, and the circuits may be disposed on a same silicon substrate 210. In a number of examples, substrate 210, which may be of silicon (Si) preconditioned with a dopant, may form the area upon which metal-oxide semiconductor (MOS) circuitry is fabricated. For instance, referring to the cross-sectional view of FIG. 2B, a thermal oxide layer 220 may be grown on the substrate 210. A doped dielectric film 230 may be deposited over the thermal oxide layer 220. As described herein, the thermal oxide layer 220 provides isolation between the doped dielectric film 230 and the substrate 210. In some examples, the monolithic integrated circuit may include a polysilicon layer over the field oxide layer and before the doped dielectric film. For instance, after growing the thermal oxide layer 220, gate control for the circuitry included in the apparatus may be achieved by depositing a polysilicon layer, or polygate 240-1, 240-2 between the thermal oxide layer 220 and the doped dielectric film 230. Additionally, as illustrated, an un-doped glass film 235 may be beneath the doped dielectric film 230 to prevent dopant migration into active areas of the integrated circuit.

As discussed with regards to FIG. 1, an aperture 270-1, 270-2, may be included in which dielectric material is removed, and subsequently coated with a protective film of a corrosive resistant an electrically insulating material, of which TEOS is provided as a non-limiting example. The apertures 270-1, 270-2 (collectively referred to herein as "apertures 270") may be formed by selectively removing the doped dielectric film 230 from the identified area(s). Although FIG. 2B illustrates the apertures 270 terminating at a termination point in the thermal oxide layer 220, additional examples are contemplated. For instance, the apertures 270 may terminate at a termination point in the substrate 210, at the top surface of the thermal oxide layer 220 (e.g., terminating at the thermal oxide layer), or terminate at the top surface of the substrate (e.g., terminating at the substrate layer). Terms to exemplify orientation, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

In some examples, the apertures 270 may be disposed between MEMS and circuitry, collocated on the same substrate 210. In various examples, the fluidic region including the apertures 270 and the fluid ports 280, may be within a threshold distance of the circuit region including the dielectric layer such that the circuit region may be exposed to the corrosive properties of fluid ejected from the fluidic region absent a sealing film or sealing structure. While FIGS. 2A and 2B illustrate the fluidic region and the circuit region being adjacent to one another on a horizontal plane, other examples are contemplated. For instance, it is contemplated that the fluidic region and the circuit region may be adjacent to one another on a vertical plane, and/or in additional adjacent arrangements.

As the fluid ports 280 of the MEMS may be collocated with the integrated circuit, a sealing film of an electrically insulating and corrosive resistant may be deposited in the apertures 270 to the edge of the respective fluid ports 280. For instance, a sealing film 260 may be deposited over the doped dielectric film 230, and into aperture 270-1 to an edge of fluid port 280-1. Similarly, the sealing film 260, such as an un-doped dielectric, may be deposited over the doped dielectric film 230, and into aperture 270-2 to an edge of fluid port 280-2. As such, each fluid port may receive the fluid, and may be defined by a respective aperture, where the aperture includes a selectively removed portion of the doped dielectric film.

Figure 3:
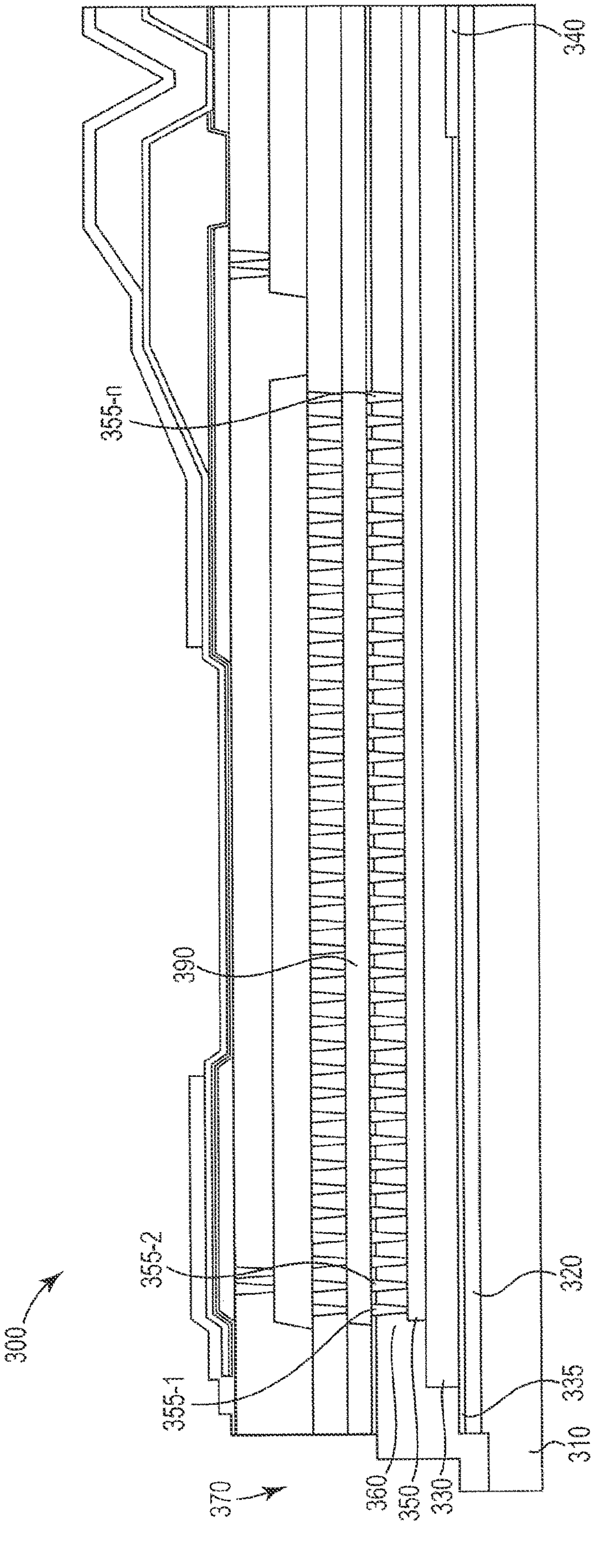
FIG. 3 illustrates an example apparatus including a circuit region and a fluidic region, consistent with the present disclosure.

FIG. 3 illustrates an example apparatus 300 including a circuit region and a fluidic region, consistent with the present disclosure. In additional examples and/or implementations, particularly those in which access to tungsten plugs for establishing electrical connectivity between the various layers of a printhead die may be lacking, selective contact etching or similar processes may be used to selectively remove the doped dielectric film 330 and/or sealing film 360 from areas in/through which electrical contact is to be established between metal layers of the apparatus 300. Metal interconnects 355-1, 355-2, **355-*n* (collectively "metal interconnects 355") may be patterned through sealing film 360 by selectively removing the sealing film 360 by using, for instance, contact etching. The metal interconnects 355 may establish electrical contact between a first metal layer 350** and a second metal layer 390. As the second metal layer 390 may be deposited over the now contact etched sealing film 360, the apertures 370 created by the contact etching process may be filled with the second metal layer 390 as it is deposited directly over the sealing film 360. In examples in which an aperture 370 is formed in the printhead die, such as aperture 170 depicted in FIG. 1, the first metal layer 150 may be completely removed from aperture 170 during the removal process. In such example, again, contact etching may be used for the removal.

In various examples, a polygate layer 340 for controlling the integrated circuitry sitting over the thermal oxide layer 320 may be patterned early in the formation of the apparatus 300. If the polygate layer 340 is patterned early in the manufacturing process so it underlies the MEMS area of the printhead, in addition to controlling the gates of the integrated circuitry, the polygate layer 340 may also raise the surface reached by the metal interconnects 355 when the doped dielectric film 330 and/or sealing film 360 is being removed, thereby increasing the ability to minimize the over-etching of a particular layer.

Figure 4:
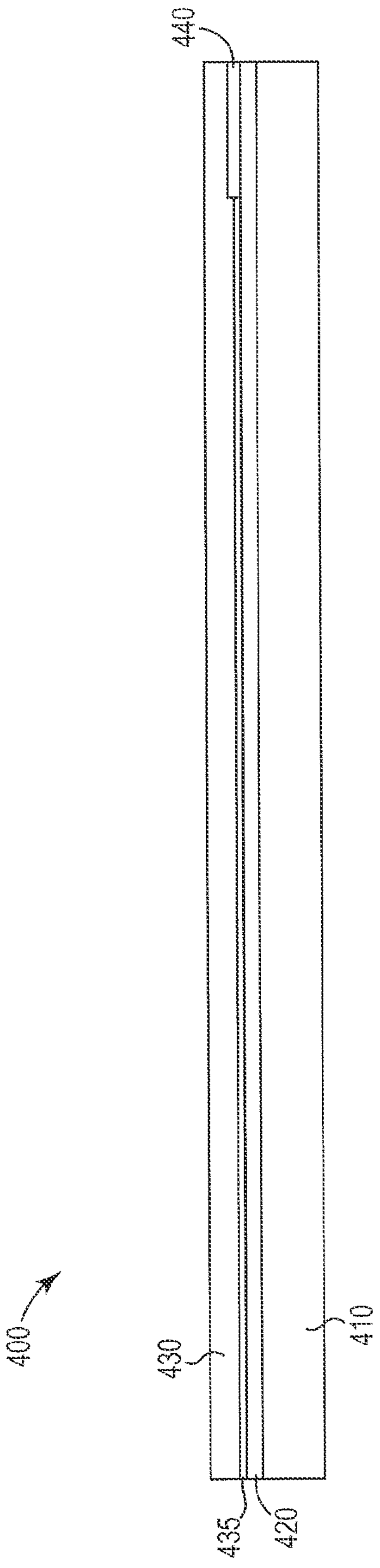
FIG. 4 illustrates an apparatus including a circuit region and a fluidic region in an intermediate product state, consistent with the present disclosure.

FIG. 4 illustrates an apparatus 400 including a circuit region and a fluidic region in an intermediate product state, consistent with the present disclosure. In a number of examples, substrate 410, which may be of silicon (Si) preconditioned with a dopant, serves as the area upon which metal-oxide semiconductor (MOS) circuitry and/or MEMS which may be included in a apparatus 400, such as a printhead, are fabricated. A thermal oxide layer 420 may be grown on the substrate 410. A doped dielectric film 430 may be deposited over the thermal oxide layer 420. The thermal oxide layer 420 may provide isolation between the doped dielectric film 430 and the substrate 410. In more specific examples, after growing the thermal oxide layer 420, gate control for the circuitry included in the apparatus may be achieved by depositing a polysilicon layer, or polygate 440 between the thermal oxide layer 420 and the doped dielectric film 430.

In various examples, doped dielectric film 430 may include a doped dielectric film which, by gettering ionic contaminants that may migrate to the interface of the various layers and/or to the active region(s) of the printhead die, helps maintain/preserve the operation of the MEMS circuitry integrated into printhead die. In some examples, the doped dielectric film may be borophosphosilicate glass (BPSG). In such examples, there may be an un-doped glass film 435 beneath the doped dielectric film 430 to prevent dopant migration into active areas of the apparatus. For instance, the un-doped glass film 435 may prevent the migration of Boron from the BPSG included in the doped dielectric film 430. As illustrated in FIG. 4, a metal layer may be over the doped dielectric film 430.

Figure 5:
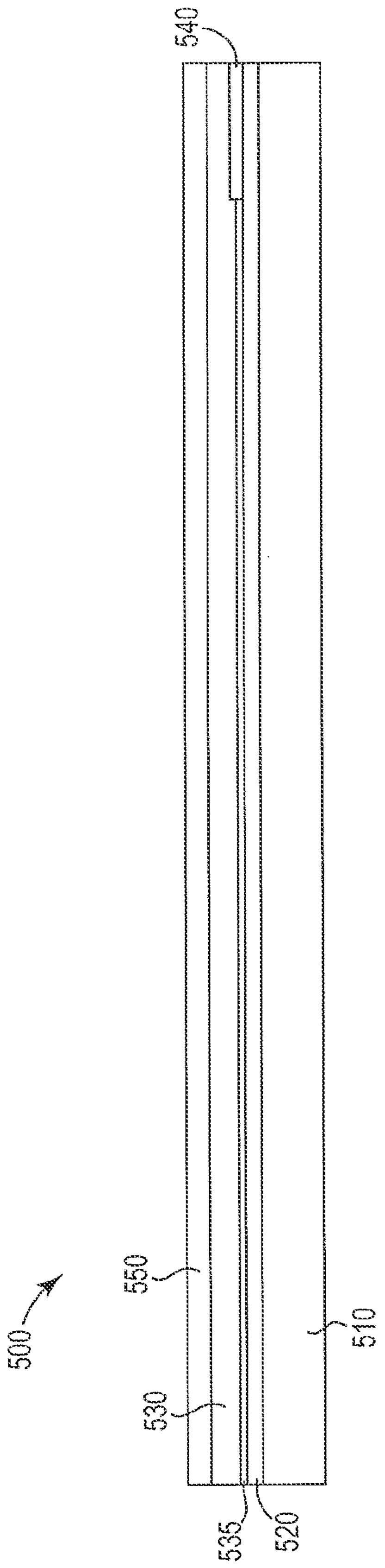
FIG. 5 further illustrates an apparatus including a circuit region and a fluidic region in an intermediate product state, consistent with the present disclosure.

FIG. 5 further illustrates an apparatus 500 including a circuit region and a fluidic region in an intermediate product state, consistent with the present disclosure. As illustrated in FIG. 5, a first metal layer 550 may be deposited over the doped dielectric film 530.

Figure 6:
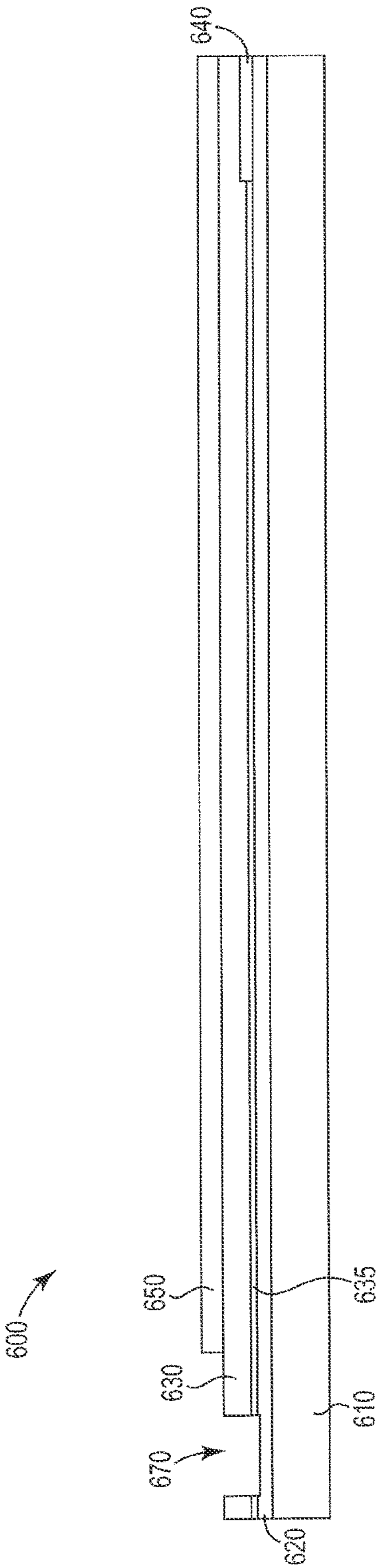
FIG. 6 further illustrates an apparatus including a circuit region and a fluidic region in an intermediate product state, consistent with the present disclosure.

FIG. 6 illustrates an apparatus 600 including a circuit region and a fluidic region in an intermediate product state, consistent with the present disclosure. Particularly, FIG. 6 illustrates an aperture 670, which is one example of a microfluidic architectural feature that may be included in apparatus 600. The aperture 170 may be formed by identifying area(s) of the apparatus 600 on which MEMS are to be located. A process, such as contact etching, may be used to selectively remove the doped dielectric film 630 from the identified area(s), as discussed with regards to FIG. 1. In some examples, the aperture 670 may be disposed between MEMS and circuitry, collocated on the same substrate 610, as discussed further with regards to FIG. 2. As illustrated in FIG. 6, the apparatus 600 may include an intermediate product in which the monolithic integrated circuit includes a polysilicon layer 640 over the field oxide 620 and before the doped dielectric film 630. The polysilicon layer 640 may be adjacent to an un-doped dielectric film 635. The polysilicon layer 640 may include an overlay region of polysilicon extending beyond the wall of the doped dielectric film 630 (not illustrated in FIG. 6).

Based upon the above discussion and illustrations, it may be recognized that various modifications and changes may be made without strictly following the various examples and applications illustrated and described herein. For example, methods as depicted in the Figures may involve steps carried out in various orders, with aspects of the disclosure herein retained, or may involve fewer or more steps. Such modifications do not depart from the true spirit and scope of various aspects of the disclosure, including aspects set forth in the claims.

What is claimed is:

1. An apparatus comprising:
- a thermal oxide layer on a silicon substrate;
- a dielectric layer over the thermal oxide layer, the dielectric layer including a doped dielectric film;
- an aperture in the dielectric layer, wherein the aperture is defined by a dielectric wall which forms part of the dielectric layer; and
- a sealing film over the dielectric wall that prevents the doped dielectric film from contacting fluid contained in a fluid port formed through a surface of the apparatus.

2. The apparatus of claim 1, wherein the sealing film includes an un-doped dielectric film over the dielectric wall.

3. The apparatus of claim 1, wherein the sealing film is an electrically insulating and corrosion resistant barrier to the doped dielectric film.

4. The apparatus of claim 1, wherein a portion of the aperture terminates at a termination point in the thermal oxide layer.

5. The apparatus of claim 1, wherein a portion of the aperture terminates at a termination point in the substrate.

6. The apparatus of claim 1, wherein a portion of the aperture terminates at the thermal oxide layer.

7. The apparatus of claim 1, wherein a portion of the aperture terminates at the silicon substrate.

8. An apparatus to receive a fluid having corrosive attributes, the apparatus comprising:
- a thermal oxide layer on a substrate;
- a doped dielectric film over the thermal oxide layer;
- a fluid port to receive a fluid and defined by an aperture, the aperture including a selectively removed portion of the doped dielectric film, wherein the aperture is defined by a wall of the doped dielectric film; and
- an un-doped dielectric film over the wall of the doped dielectric film, wherein the un-doped dielectric film protects the doped dielectric film from corrosive attributes of the fluid.

9. The apparatus of claim 8, wherein the fluid port is adjacent the substrate.

10. The apparatus of claim 8, wherein the thermal oxide layer is adjacent the fluid port.

11. The apparatus of claim 8, further comprising a sealing film over the doped dielectric film.

12. An apparatus, comprising:
- a field oxide layer over a substrate;
- the doped dielectric film over the field oxide layer;

a metal layer over the doped dielectric film; and an aperture disposed in a region of the microfluidic device to eject fluid, wherein the aperture is defined by a wall of the doped dielectric film; and an un-doped dielectric film over the wall of the doped dielectric film to protect the doped dielectric film of the monolithic integrated circuit from corrosive attributes of the fluid.

13. The apparatus of claim 12, wherein the aperture is adjacent the substrate.

14. The apparatus of claim 12, wherein field oxide layer is adjacent the aperture.

15. The apparatus of claim 12, wherein an intermediate product of the apparatus includes a polysilicon layer over the field oxide and before the doped dielectric film, the polysilicon layer including an overlay region of polysilicon extending beyond the wall of the doped dielectric film.

* * * * *